United States Patent [19]
Williamson et al.

[11] Patent Number: 6,091,594
[45] Date of Patent: Jul. 18, 2000

[54] PROTECTION CIRCUITS AND METHODS OF PROTECTING A SEMICONDUCTOR DEVICE

[75] Inventors: Jon R. Williamson, San Jose; Edward Nowak, Pleasanton; Emmanuel de Muizon, Fremont, all of Calif.

[73] Assignee: VLSI Technology, Inc., Sunnyvale, Calif.

[21] Appl. No.: 09/025,215

[22] Filed: Feb. 18, 1998

[51] Int. Cl.[7] .................................................. H02H 9/04
[52] U.S. Cl. ............................................. 361/111; 361/56
[58] Field of Search .................................. 361/56, 57, 88, 361/89, 91.4, 93.1, 94, 111; 257/355–360; 327/306, 309, 310

[56] References Cited

U.S. PATENT DOCUMENTS

| | | | |
|---|---|---|---|
| 5,596,474 | 1/1997 | Wada et al. | 361/111 |
| 5,780,897 | 7/1998 | Krakauer | 257/368 |
| 5,905,614 | 5/1999 | Colombo | 361/56 |
| 5,910,874 | 6/1999 | Iniewski et al. | 361/56 |
| 5,930,094 | 7/1999 | Amerasekera et al. | 361/56 |

OTHER PUBLICATIONS

Linewidth Control Effects on MOSFET ESD Robustness, S. Voldman, J. Never, S. Holmes, and J. Adkisson, p. 27.1–27.9, EOS/ESD Symposium 96–101. (Date unknown).
ESD Protection In a Mixed–Voltage Interface and Multi–Rail Disconnection Power Grid Environment In 0.50 and 0.25–$\mu$m Channel Length CMOS Technologies, Steven H. Voldman, p. 3.4.1–3.4.10, EOS/ESD Symposium 94–125 (Date unknown).

*Primary Examiner*—Jeffrey Gaffin
*Assistant Examiner*—Kim Huynh
*Attorney, Agent, or Firm*—Wells, St. John, Roberts, Gregory & Matkin, PS

[57] ABSTRACT

Protection circuits and methods of protecting a semiconductor device are provided. According to one aspect, the present invention provides a protection circuit adapted to be coupled to a ground connection, pad and power bus of a semiconductor device, the protection circuit includes electrically coupled first and second transistors adapted to be coupled between a pad and a ground connection, the first and second transistors having a common diffusion region coupling the first transistor with the second transistor in a cascode configuration, the first transistor having a gate adapted to be coupled to a power bus to receive a bias voltage, the power bus being substantially electrically isolated from the pad.

57 Claims, 5 Drawing Sheets

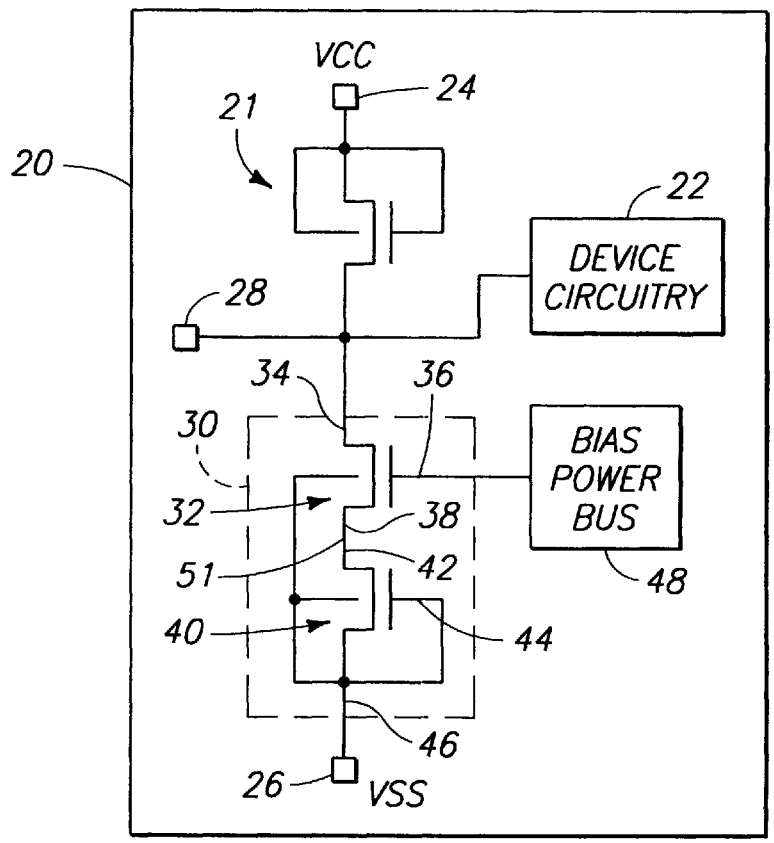
$\text{Fig. 1}$
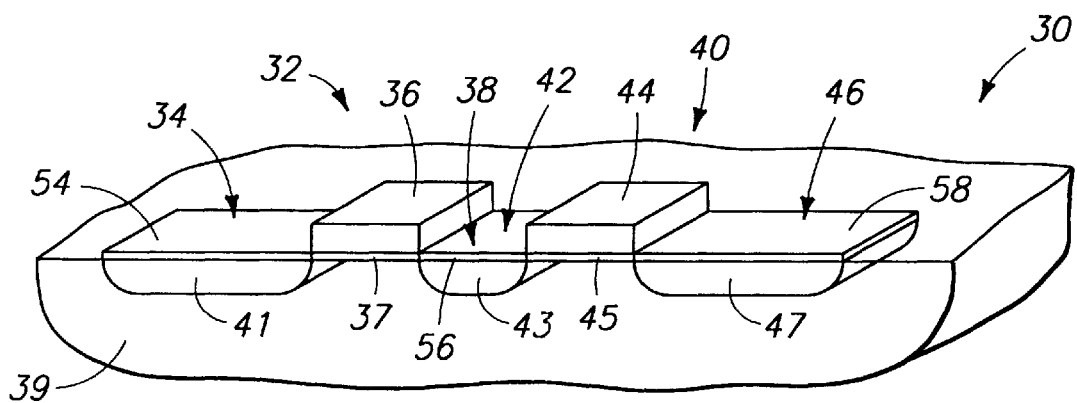
$\text{Fig. 2}$

PROTECTION CIRCUITS AND METHODS OF PROTECTING A SEMICONDUCTOR DEVICE

TECHNICAL FIELD

The present invention relates to protection circuits and methods of protecting a semiconductor device.

BACKGROUND OF THE INVENTION

Semiconductor devices can include input/output (I/O) drivers at interface connections. There exists an increasing demand for I/O drivers which can tolerate high drain and gate voltages without incurring hot carrier or gate oxide degradation. The scaling of gate oxides in deep sub-micron technologies in combination with customer demands for mixed voltage product applications has forced designers to create I/O drivers which meet such demands.

One method to achieve both lower hot carrier generation and reduce the maximum field across the gate oxide is to use cascode configured output drivers. Conventional cascoded I/O drivers typically include plural MOS devices intermediate the I/O pad and power and/or ground.

It is generally recognized that some semiconductor devices are susceptible to damage from electrical overstress conditions (EOS). These conditions occur when the voltage or amperage ratings for a circuit are exceeded. Exemplary electrical overstress conditions include electrostatic discharge (ESD), transient conditions, latch-up, incorrect polarity connections, etc. The electrical overstress conditions are characterized by over-voltage and over-current stress events.

Overcoming electrostatic discharge conditions continues to increase in importance as the sensitivity of semiconductor devices increases. Electrostatic charge (ESC) can accumulate in a body and damage semiconductor devices and circuitry therein if the body is brought into contact with the devices. For example, a person may accumulate electrostatic charge by walking across carpeting. The accumulated electrostatic charge can be imparted to semiconductor devices touched by the individual. Some semiconductor devices are sufficiently sensitive that the resultant flow of charge imparted to the device results in permanent damage to the semiconductor device.

Accordingly, it is highly desired to protect semiconductor devices from electrostatic discharge and other electrical overstress conditions. Some solutions have attempted to minimize the accumulation of electrostatic charge to prevent electrostatic discharge. Exemplary solutions have included utilization of protective clothing such as shoes, smocks, etc. for workers in the semiconductor industry. Such approaches may alleviate the problem of electrostatic discharge to some extent but consumers may not be aware of the potential damaging effects of electrostatic discharge upon the electronic components being handled.

Other approaches for abating electrical overstress conditions and electrostatic discharge events with regard to electrical components has included providing electrostatic discharge components within the electrical or semiconductor components themselves. Conventional methods of implementing electrostatic discharge current protection for semiconductor devices include providing discharge paths in parallel to I/O pads of the semiconductor device being protected.

Such methods can be successful at alleviating susceptibility to electrostatic discharge damage, but also introduce other drawbacks. For example, the electrostatic discharge protection devices can increase capacitance at the I/O pads resulting in decreased performance of the semiconductor device. Decreased performance is highly undesirable inasmuch as speed of some semiconductor devices is of paramount importance. Another exemplary drawback includes the consumption of additional surface area of the substrate to implement the electrical overstress and electrostatic discharge protection.

Therefore, there exists a need to provide improved protection from electrical overstress conditions which overcomes the drawbacks associated with the prior art.

BRIEF DESCRIPTION OF THE DRAWINGS

Preferred embodiments of the invention are described below with reference to the following accompanying drawings.

FIG. 1 is a schematic diagram illustrating an embodiment of a protection circuit according to the present invention within a semiconductor device.

FIG. 2 is a physical representation of the protection circuit of FIG. 1.

DETAILED DESCRIPTION OF THE PREFERRED EMBODIMENTS

Figure 3:
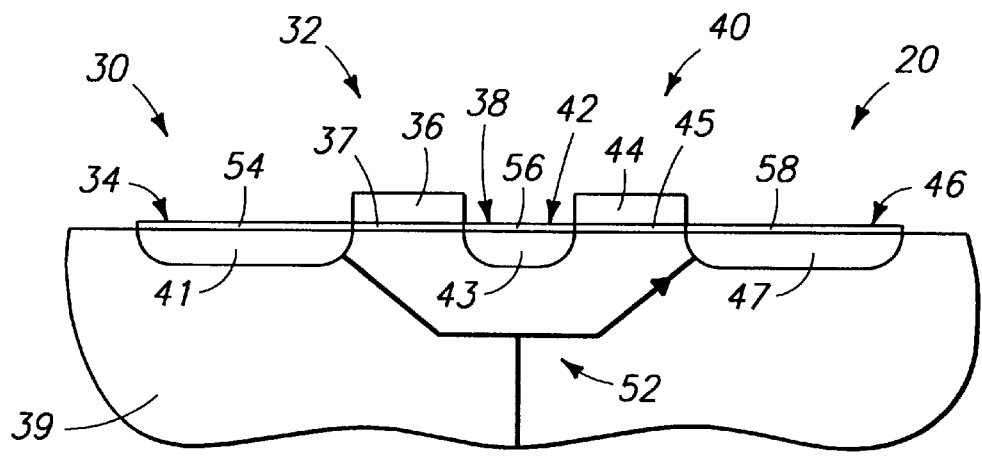
FIG. 3 is a diagrammatic representation of a parasitic bipolar transistor of the protection circuit.

This disclosure of the invention is submitted in furtherance of the constitutional purposes of the U.S. Patent Laws "to promote the progress of science and useful arts" (Article 1, Section 8).

Referring to FIG. 1, a semiconductor device 20 including protection circuitry 30 according to the present invention is shown. Semiconductor device 20 comprises a semiconductor chip, such as a logic or memory device, in the described embodiment. Protection circuitry 30 of the present invention is not limited to such applications. In operation, semiconductor device 20 of the described embodiment is coupled with other circuitry, external power supplies and data connections. Following fabrication of semiconductor device 20, there may exist a period of time in which device 20 is not in operation and is not coupled with external circuitry, power or data connections. Semiconductor device 20 is susceptible to electrostatic discharge events prior to application within an electrical device and connection with external devices.

Protection circuitry 30 is configured to protect semiconductor device 20 and internal components of semiconductor device 20 from exposure to over-currents, also referred to as excessive or stress currents. For example, the illustrated protection circuitry 30 is configured to protect semiconductor device 20 from electrostatic discharge (ESD) currents following fabrication of semiconductor device 20 and prior to device 20 being placed into operation. Protection circuitry 30 can also protect semiconductor device 20 from transient situations which can occur during operation of semiconductor device 20.

Semiconductor device 20 includes device circuitry 22, a $V_{CC}$ power source connection or node 24, $V_{SS}$ ground connection or node 26, and an Input/Output (I/O) pad connection 28. Device circuitry 22 includes logic or memory circuitry in exemplary embodiments. Supply voltage connection 24 is configured to receive a supply voltage from an external source (not shown). Typically, connection 24 is powered at a higher voltage potential than device circuitry 22. Exemplary voltages of connection 24 include 1.8, 3.3 and 5 Volts. Ground node 26 is at a voltage potential less than the potential at pad 28 and supply voltage connection 24 in the described embodiment. Node 26 is generally referred to as a ground connection herein.

Device 20 includes a PMOS driver 21 coupled intermediate power node 24 and I/O pad 28. Protection circuit 30 comprises a cascoded NMOS driver in the illustrated embodiment.

Pad 28 is configured for coupling with an external pin of semiconductor device 20. Pad 28 can be configured to one of receive input data and transmit output data, or provide both inputting and outputting of signals. Device circuitry 22 is configured to output signals to pad 28 and receive signals from pad 28.

Circuit 30 is configured to provide protection from stress currents which may pass into or out of electronic device 20 via pad 28. The depicted cascode protection circuit 30 is coupled intermediate ground connection 26 and pad 28 of semiconductor device 20.

The illustrated protection circuit 30 includes a first or upper transistor 32 and a second or lower transistor 40. First and second transistors 32, 40 comprise metal-oxide semiconductors in the described embodiment. First and second MOS devices 32, 40 preferably comprise NMOS devices. Metal oxide semiconductors of other configurations are used in alternative embodiments.

First and second MOS devices 32, 40 are connected in series in a cascode configuration in the illustrated embodiment. First MOS device 32 is coupled to pad 28 and second MOS device 40 is connected to $V_{SS}$ or ground node 26. First MOS device 32 includes a drain 34, a gate 36 and a source 38. Second MOS device 40 includes a drain 42, a gate 44 and a source 46.

Drain 34 of first MOS device 32 is coupled with I/O pad 28 in the depicted embodiment. Further, source 38 of device 32 is electrically coupled with drain 42 of second MOS device 40. Source 38 and drain 42 are coupled at a node 51. Source 46 of device 40 is coupled with ground node 26. Protection device 30, including MOS devices 32, 40, is configured to shunt stress currents from pad 28 to ground connection 26 in the described embodiment. Such shunting protects device circuitry 22 and other components of semiconductor device 20.

Semiconductor device 20 includes a bias power bus 48. Power bus 48 is adapted to couple with an external biasing voltage source in the described embodiment (not shown). Bus 48 can be coupled with the $V_{CC}$ source or another voltage source. Bus 48 is coupled with the biasing source when semiconductor device 20 is in operation. The external biasing voltage source applies a biasing voltage via power bus 48 to components of semiconductor device 20. In typical arrangements, the external voltage source and bus 48 provide power at an equal or lower potential than the voltage of $V_{CC}$ connection 24.

Bias power bus 48 is coupled with gate 36 of first MOS device 32. Following attachment of semiconductor device 20 within an electronic device, gate 36 is configured to receive a biasing voltage from bias power bus 48. In most embodiments, it is desired to provide gate 36 at a logic high value during operation of electronic device and semiconductor device 20.

Prior to the coupling of semiconductor device 20 within the electronic device, gate 36 of first MOS device 32 is provided at a digital low value or is permitted to float. As discussed below, it is preferred to provide gate 36 of device 32 at a low voltage potential (i.e., digital low value) prior to operation of semiconductor device 20 or coupling of device 20 with other components. It is preferred to bias gate 36 at a logic low value during an electrical overstress condition.

Referring to FIG. 2, semiconductor device 20 includes a substrate 39. Substrate 39 comprises a semiconductive material, such as silicon. A plurality of diffusion regions 41, 43, 47 are formed within substrate 39. Substrate 39 comprises a P-type material in the described embodiment and diffusion regions 41, 43, 47 comprise N+ type regions in the described embodiment. Metallization is provided over diffusion regions 41, 43, 47. Metallization forms conductive contacts 54, 56, 58 for coupling with respective diffusion regions 41, 43, 47. Conductor 54 of drain 34 of first MOS device 32 is coupled with pad 28 of semiconductor device 20. Conductor 58 of source 46 of second MOS device 40 is coupled with ground node 26.

MOS devices 32, 40 include gate oxide insulating regions 37, 45 formed intermediate diffusion regions 41, 43, and regions 43, 47, respectively. Gate oxides 37, 45 comprise silicon dioxide in one embodiment. Gates 36, 44 are formed upon oxides 37, 45 of the respective MOS devices 32, 40. Gates 36, 44 comprise polysilicon in one embodiment.

Referring to FIG. 3, diffusion region 43 comprises a common diffusion region or node intermediate first and second MOS devices 32, 40 of cascode protection circuit 30. Diffusion region 43 corresponds to common node 51 of FIG. 1. Common diffusion node 43 is shared between source 38 of first MOS device 32 and drain 42 of second MOS device 40. Forming protection circuit 30 in the depicted configuration provides certain advantages discussed below with respect to protecting semiconductor device 20 from excessive currents resulting from electrical overstress events.

In particular, providing common diffusion region 43 of first and second MOS devices 32, 40 permits triggering of a parasitic bipolar junction NPN transistor (BJT) 52 within semiconductor device 20 during stress events. Bipolar transistor 52 includes N+ type diffusion regions 41, 47 and P-type substrate 39. Transistor 52 operates to shunt stress currents including electrostatic discharge currents intermediate drain 34 of upper or first MOS device 32 and source 46 of lower or second MOS device 40.

When bipolar NPN transistor 52 is triggered, cascode protection circuit 30 shunts stress currents from pad 28 to ground connection 26. In particular, the stress currents present at pad 28 are shunted via the parasitic BJT transistor 52 to ground connection 26. Bipolar transistor 52 is configured to shunt the stress currents via drain 34 of first MOS device 32, substrate 39 and source 46 of second MOS device 40.

In the preferred embodiment, gate 36 of first MOS device 32 is biased at a logic low value to provide increased protection from stress currents. It is preferred to electrically isolate gate 36 of first MOS device 32 from stress currents present at pad 28. In the preferred embodiment, gate 36 is isolated from power supplies or power busses utilized to bias an n-well within semiconductor device 20 containing a PMOS device resistively tied to pad 28.

Referring to FIGS. 4–7, the performance (i.e., level of overstress protection) of circuit 30 with respect to biasing of gate 36 of first MOS device 32 is described. More specifically, varying the biasing voltage applied to gate 36 of first MOS device 32 varies the level of overstress protection provided by protection circuit 30. Biasing first MOS device 32 at a logic low value increases the performance or overstress protection provided by protection circuit 30.

Figure 4:
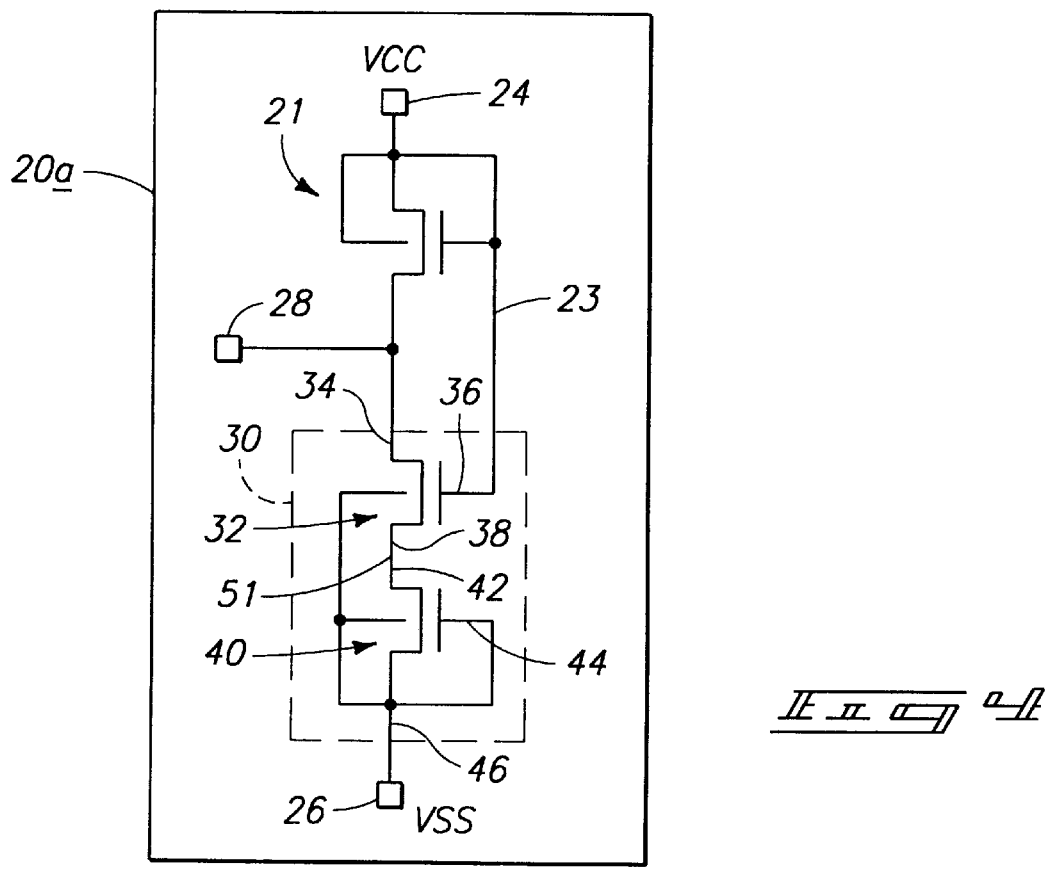
FIG. 4 is a schematic diagram of the protection circuit within a semiconductor device.

Referring to FIG. 4, PMOS driver 21 and cascoded NMOS driver protection circuit 30 of a test device 20a are coupled with I/O pad 28. Circuitry 21, 30 of exemplary test device 20a was fabricated using a 0.25 micron, salicided, twin-well CMOS process. First and second MOS devices 32, 40 have channel lengths of 0.25 microns and channel widths of 20 microns.

Gate 44 and the substrate of second MOS device 40 were both held at common ground during testing. Testing was conducted while biasing gate 36 of first MOS device 32 at 0 Volts, 3 Volts and 5 Volts. A connection 23 was utilized to couple gate 36 and voltage source 24 to provide logic high values to gate 36. Voltage source 24 was configured to provide one of either five Volts or three Volts to gate 36.

Gate 36 was isolated from source 24 to provide testing at zero Volts corresponding to a logic low value. In the described test operations, connection 23 was cut using a focused ion beam. During testing, transmission line pulsing (TLP) pulses were applied across I/O pad 28 and ground node 26.

Figure 5:
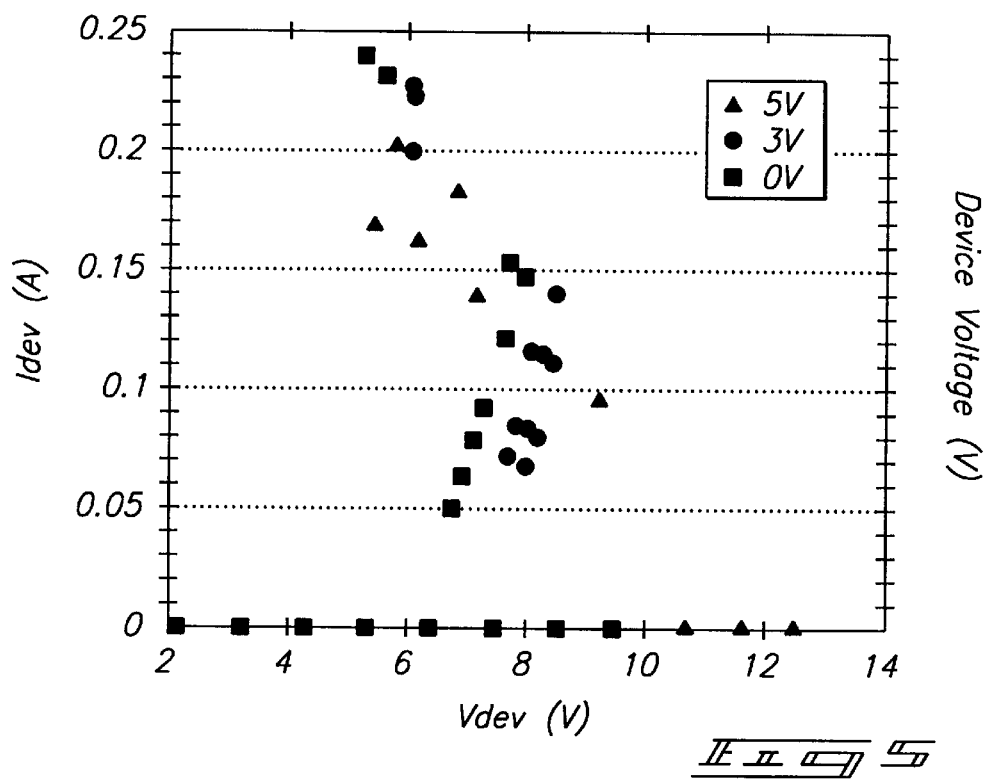
FIG. 5 is an I-V snapback plot of the protection circuit.

Referring to FIG. 5, an I-V plot illustrates snapback behavior of test device 20a. In particular, the plot illustrates snapback behavior for biasing of gate 36 at 0 Volts, 3 Volts and 5 Volts. As shown, the thermal breakdown current of cascode protection circuit 30 decreases as the bias voltage of gate 36 increases. In addition, the trigger voltage of protection circuit 36 increases as the bias voltage of gate 36 increases.

Figure 6:
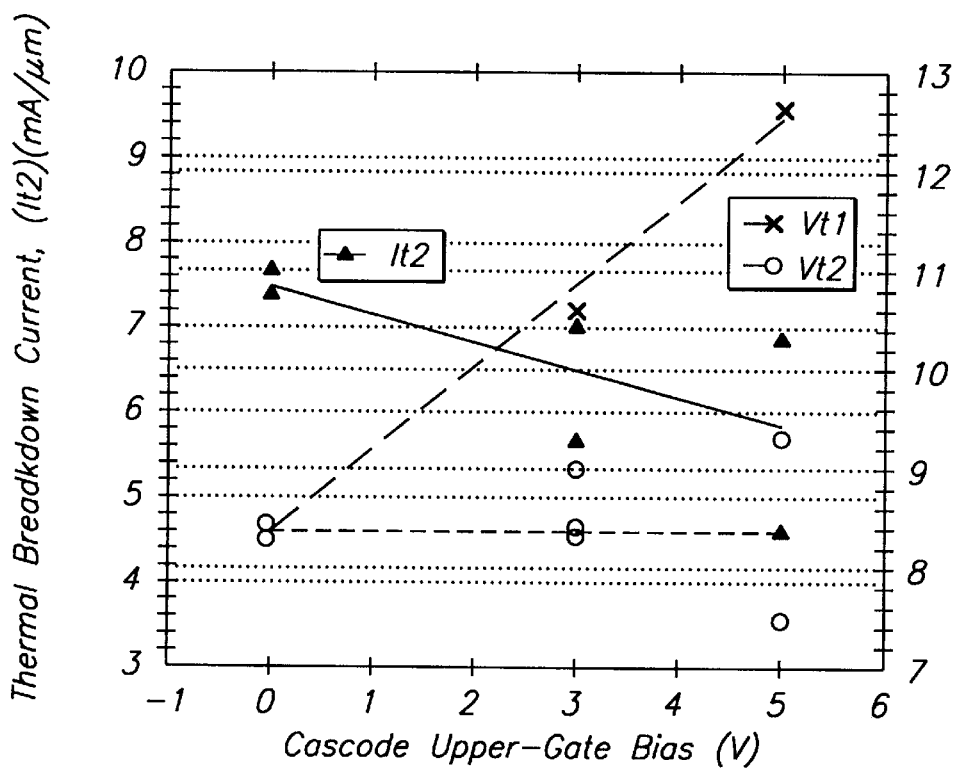
FIG. 6 is a plot illustrating the trigger voltage, thermal breakdown current and thermal breakdown voltage of the protection circuit.

Referring to FIG. 6, effects of the biasing voltage upon gate 36 are shown with respect to the trigger voltage, thermal breakdown current, and thermal breakdown voltage of protection circuit 30. The trigger voltage of protection circuit 30 exceeds the thermal breakdown voltage when a slight positive voltage bias is applied to gate 36. This suggests that in multiple finger configurations, as would be typically used in a standard output buffer, only a few fingers would possibly trigger resulting in lower than expected electrostatic discharge protection when a positive voltage bias is applied to gate 36.

Figure 7:
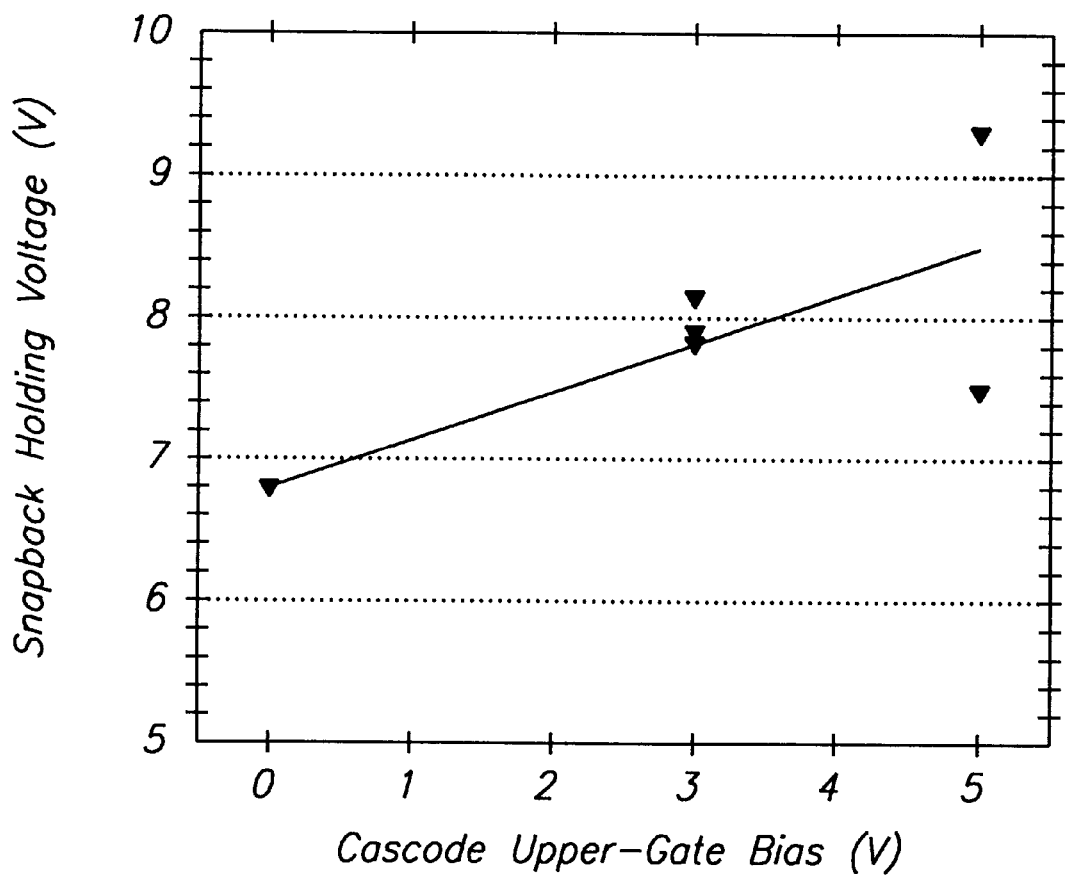
FIG. 7 is a plot illustrating the snapback holding voltage of the protection circuit.

Referring to FIG. 7, the snapback holding voltage of cascode protection circuit 30 is shown as a function of the biasing voltage applied to gate 36. The holding voltage of circuit 30 increases with the application of increased biasing voltages to gate 36. The application of higher biasing voltages to gate 36 results in more power being dissipated in the cascoded protection circuit 30 during an electrostatic discharge event. An increased dissipation of power creates a higher potential for thermal damage within cascoded protection circuit 30.

Referring again to FIG. 4, gate 36 is shown connected to the $V_{CC}$ supply voltage connection 24. Further, the $V_{CC}$ supply voltage also acts as a supply for PMOS I/O driver 21. Such a configuration couples gate 36 with I/O test pad 28 through the drain p+/n-well diode of PMOS device 21. Application of a positive human body model (HBM) pulse to pad 28 provides a positive bias to gate 36 of first MOS device 32 through the p+/n-well diode. Human body model testing performed on protection circuit 30 illustrated an electrostatic discharge failure voltage of less than 1 kV when a positive bias voltage was present at gate 36.

Protection circuit 30 was tested in a second trial with a connection 23 intermediate voltage supply $V_{CC}$ connection 24 and gate 36 opened. In the second trial, gate 36 was substantially electrically isolated from $V_{CC}$ voltage supply connection 24. Connection 23 is opened using the focused ion beam to provide isolation of gate 36 from connection 24. Human body model failure voltage exceeded 4 Kv with connection 23 opened.

The above testing illustrates that NMOS cascoded output drivers can be used effectively for stress current protection and electrostatic discharge protection. The biasing of the upper or first MOS device 32 during an overstress event, such as an electrostatic discharge event, affects the level of stress protection. In particular, it is preferred to provide gate 36 of first MOS device 32 of cascode protection circuit 30 at a logic low value during a overstress event, such as an electrostatic discharge event.

Figure 8:
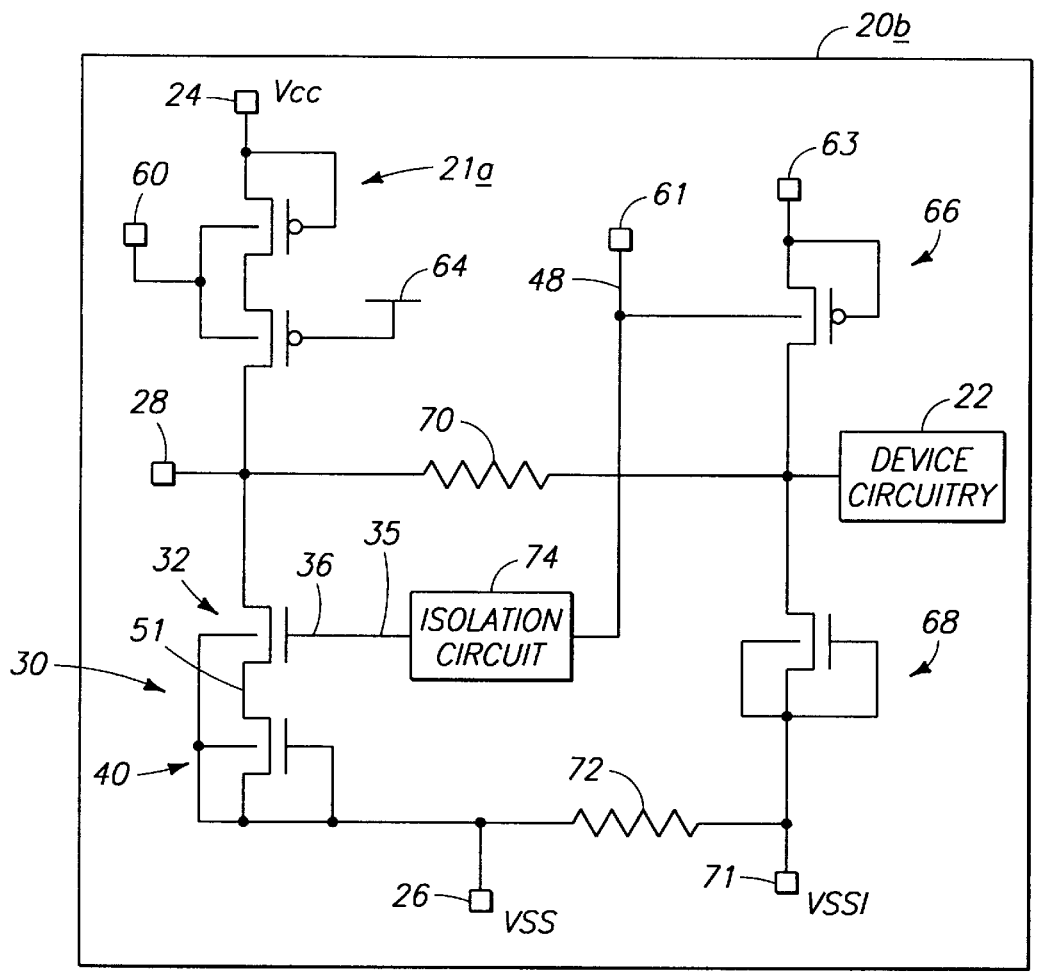
FIG. 8 is a schematic diagram of the protection circuit within a semiconductor device having local voltage clamp circuitry.

Referring to FIG. 8, protection circuitry 30 is shown in an alternative semiconductor device 20b. I/O pad 28 is coupled with PMOS driver 21a and protection circuitry 30. Pad 28 is additionally coupled with a PMOS local voltage clamp 66 and an NMOS local voltage clamp 68. Semiconductor device 20b includes a plurality of supply voltage connections 24, 60, 61, 63 for coupling with respective external power supplies (not shown). Connections 24, 60, 61, 63 individually provide supply voltages to circuitry of semiconductor device 20b.

Device circuitry 22 is coupled with PMOS and NMOS local voltage clamps 66, 68 and I/O pad 28. PMOS and NMOS local voltage clamps 66, 68 provide electrostatic discharge protection to input devices within device circuitry 22. Device circuitry 22 includes a core and pre-driver in one embodiment of semiconductor device 20. In addition, PMOS and NMOS local voltage clamps 66, 68 are configured to minimize or eliminate gate-oxide damage of protection circuit 30 during a pad-to-power supply stress between I/O pad 28 and power supply 61.

PMOS local voltage clamp 66 is provided intermediate voltage source connection 63 and pad 28. NMOS local voltage clamp 68 is provided intermediate pad 28 and $V_{SSI}$ node 71. $V_{SSI}$ node 71 is at the voltage potential of $V_{SS}$ ground node 26 plus a voltage drop across the resistance 72 of the substrate of device 20b.

A CDM current resistor 70 is provided intermediate I/O pad 28 and PMOS and NMOS local voltage clamps 66, 68. CDM current resistor 70 is provided to minimize the effects of charged device model (CDM) electrostatic discharge events upon internal components and circuitry of semiconductor device 20b.

During charged device model electrostatic discharge events, a charge exists within semiconductor device 20a and typically within device circuitry 22. The built-up charge can be subsequently drawn through I/O pad 28 responsive to the grounding of pad 28. CDM current resistor 70 operates to slow or impede charged device model electrostatic currents drawn toward pad 28 enabling protection circuit 30 to safely shunt the charged device model electrostatic discharge currents to ground.

Gate 36 of first MOS device 32 is preferably connected to a power supply which is independent or electrically isolated from I/O pad 28. It is preferred to bias gate 36 of first MOS device 32 using an independent voltage source not coupled with an n-well containing a PMOS device. Utilization of a voltage source coupled with an n-well containing a PMOS device can result in biasing of gate 36 from I/O pad 28 through the PMOS drain p+/n-well diode during an electrical overstress event.

In some configurations it is not possible to utilize a voltage source for biasing gate 36 which is not coupled with an n-well containing a PMOS device. For example, voltage source 61 biases gate 36 of first MOS device 32 and is coupled with the n-well containing the PMOS device of voltage clamp 66. PMOS local voltage clamp 66 provides a detrimental diode path to gate 36 of first MOS device 32 in the illustrated configuration of semiconductor device 20b. In addition, a stress current discharge path from power supply 61 is provided to I/O pad 28 through PMOS local voltage clamp 66. Therefore, it is preferred to provide an isolation device or circuit 74 intermediate voltage source 61 and gate 36.

Isolation device or circuit 74 is shown in FIG. 8. Isolation circuit 74 protects gate 36 of first MOS device 32. Isolation circuit 74 operates to isolate gate 36 of first MOS device 32 from the p+/n-well diode inherent within PMOS local voltage clamp 66 and stress currents at pad 28. Isolation circuit 74 is configured to minimize a rising of the voltage potential at gate 36 of first MOS device 32 during an overstress event. Isolation circuit 74 is ideally utilized to maintain the bias voltage at gate 36 at a digital logic low value during an overstress event. The depicted isolation circuit 74 is also configured to provide a logic high biasing signal to gate 36 when semiconductor device 20b is in normal operation and no electrical overstress condition is present. Isolation circuit 74 substantially electrically isolates gate 36 from power bus 48 responsive to the presence of a stress current at pad 28.

Figure 9:
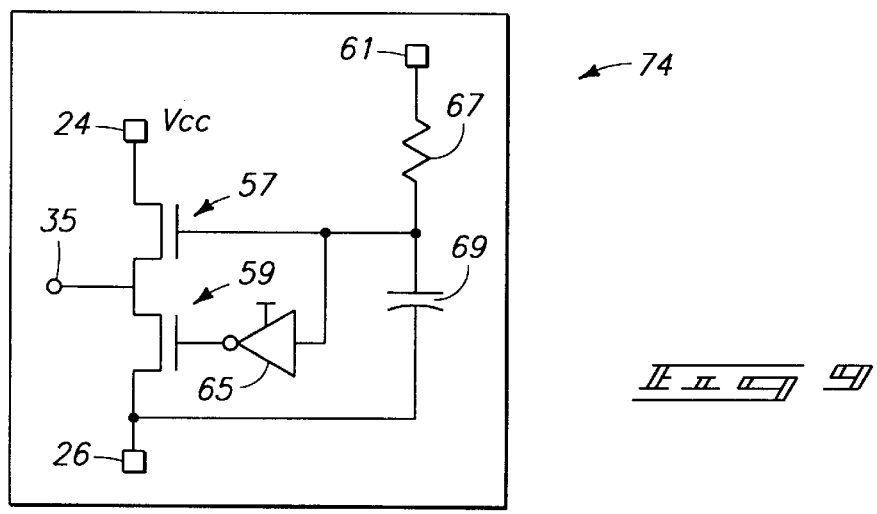
FIG. 9 is an embodiment of an isolation circuit.

Referring to FIG. 9, one embodiment of an isolation circuit 74 is shown in detail. Isolation circuit 74 provides a biasing voltage at node 35. Node 35 is coupled with gate 36 of first MOS device 32. Isolation circuit 74 is configured to provide a logic high value at node 35 during operation of semiconductor device 20b at a normal condition. Further, isolation circuit 74 is configured to provide a digital low value at node 35 coupled with gate 36 of first MOS device 32 during an overstress event, such as the presence of an electrostatic discharge current at I/O pad 28.

The illustrated isolation circuit 74 includes NMOS devices 57, 59, inverter 65, resistor 67, and capacitor 69. Power supply 61 is coupled with resistor 67. NMOS devices 57, 59 are coupled in series intermediate power supply connection 24 and ground connection 26. Node 35 is coupled with source and drain connections of respective NMOS devices 57, 59. Resistor 67 and capacitor 69 of the illustrated isolation circuit 74 are configured to provide an RC time constant of 160 ns.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A protection circuit adapted to be coupled to a ground connection, pad and power bus of a semiconductor device, the protection circuit comprising a first transistor electrically coupled with a second transistor, the first transistor and the second transistor being configured to be coupled between the pad and the ground connection, the first and second transistors having a common diffusion region coupling the first transistor with the second transistor in a cascode configuration, the first transistor having a gate adapted to be coupled to the power bus to receive a bias voltage, the power bus being substantially electrically isolated from the pad, the protection circuit further comprising circuitry configured to provide the gate at a digital low value during the presence of stress currents at the pad.

2. The protection circuit according to claim 1 wherein the gate is substantially electrically isolated from the pad.

3. The protection circuit according to claim 1 wherein the first and second transistors comprise MOS devices.

4. The protection circuit according to claim 3 wherein the common diffusion region comprises a source of the first MOS device and a drain of the second MOS device.

5. The protection circuit according to claim 1 wherein the first and second transistors comprise MOS devices configured to form a parasitic bipolar device.

6. The protection circuit according to claim 1 wherein the first and second transistors comprise NMOS devices.

7. The protection circuit according to claim 1 wherein the first and second transistors shunt stress currents.

8. The protection circuit according to claim 1 wherein the circuitry comprises an isolation circuit configured to isolate the gate from the power bus.

9. A stress current protection circuit adapted to be coupled to a ground connection and a pad of a semiconductor device, the protection circuit comprising a cascode including a first MOS device and second MOS device electrically coupled in series, the first MOS device being adapted to be coupled to the pad, the second MOS device being adapted to be coupled to the ground connection, the first and second MOS devices being electrically coupled via a common diffusion region, the protection circuit further comprising an isolation circuit configured to provide a gate of the first MOS device at a digital low value during the presence of stress currents present at the pad.

10. The protection circuit according to claim 9 wherein the cascode is configured to form a parasitic bipolar device operable to shunt the stress currents.

11. The protection circuit according to claim 9 wherein the cascode is configured to shunt electrostatic discharge currents.

12. The protection circuit according to claim 9 wherein the first and second MOS devices comprise NMOS devices.

13. The protection circuit according to claim 9 wherein the common diffusion region comprises a source of the first MOS device and a drain of the second MOS device.

14. A protection circuit adapted to be coupled to a ground connection, a pad and a power bus of a semiconductor device, the protection circuit comprising:
  a cascode including a first MOS device and second MOS device electrically coupled in series, the first MOS device being adapted to be coupled to the pad, the second MOS device being adapted to be coupled to the ground connection, the first and second MOS devices being electrically coupled via a common diffusion region; and
  an isolation circuit configured to substantially electrically isolate a gate of the first MOS device from the power bus responsive to the presence of a stress current at the pad and to provide the gate at a digital low value during the presence of the stress current.

15. The protection circuit according to claim 14 wherein the first and second MOS devices comprise NMOS devices.

16. The protection circuit according to claim 14 wherein the common diffusion region comprises a source of the first MOS device and a drain of the second MOS device.

17. The protection circuit according to claim 14 wherein a drain of the first MOS device is adapted to be coupled with the pad and the source of the second MOS device is adapted to be coupled with the ground connection.

18. The protection circuit according to claim 14 wherein the cascode is configured to shunt stress currents from the pad to the ground connection.

19. The protection circuit according to claim 14 wherein the cascode is configured to shunt electrostatic discharge currents from the pad to the ground connection.

20. A protection circuit adapted to be coupled to a ground connection and a pad of a semiconductor device, the protection circuit comprising a cascode including a first transistor and second transistor electrically coupled in series, the first transistor being adapted to be coupled to the pad, the second transistor being adapted to be coupled to the ground connection, the cascode being configured to shunt stress currents from the pad to the ground connection, the protection circuit further comprising circuitry configured to provide the gate at a digital low value during the presence of stress currents at the pad.

21. The protection circuit according to claim 20 wherein the circuitry comprises an isolation circuit configured to isolate a gate of the first transistor from the stress currents.

22. The protection circuit according to claim 20 wherein the first and second transistors comprise NMOS devices.

23. The protection circuit according to claim 20 wherein the first and second transistors comprise MOS devices.

24. The protection circuit according to claim 23 wherein the first and second MOS devices are electrically coupled via a common diffusion region.

25. The protection circuit according to claim 24 wherein a source of the first MOS device and a drain of the second MOS device individually comprise the common diffusion region.

26. The protection circuit according to claim 23 wherein a drain of the first MOS device is adapted to be coupled with the pad and the source of the second MOS device is adapted to be coupled with the ground connection.

27. The protection circuit according to claim 20 wherein the cascode is configured to shunt electrostatic discharge currents.

28. A protection circuit adapted to be coupled to a ground connection, pad and power bus of a semiconductor device, the protection circuit comprising:
   a cascode including:
      a first NMOS device including a source, drain and gate, the drain of the first NMOS device being adapted to be coupled to the pad and the gate of the first NMOS device being adapted to be coupled to the power bus to receive a bias voltage; and
      a second NMOS device electrically coupled in series with the first NMOS device and the second MOS device includes a source, drain and gate, the source of the second NMOS device being adapted to be coupled to the ground connection;
      a common diffusion region coupled with the source of the first NMOS device and the drain of the second NMOS device;
      wherein the cascode is configured to shunt electrostatic discharge circuits from the pad to the ground connection via the first NMOS device and second NMOS device; and
   an isolation circuit coupled with the pad and the power bus, the isolation circuit being configured to substantially electrically isolate the gate of the first NMOS device from electrostatic discharge currents present at the pad and to provide the gate of the first NMOS device at a digital low value during the presence of electrostatic discharge currents at the pad.

29. A method of protecting a semiconductor device comprising:
   coupling a cascode having first and second MOS devices intermediate a pad and a ground connection of a semiconductor device;
   coupling the first and second MOS devices of the cascode with respective ones of the pad and ground connection;
   shunting a stress current from the pad to the ground connection using the cascode; and
   biasing a gate of the first MOS device at a digital low value during the shunting.

30. The method according to claim 29 further comprising coupling the first and second MOS devices using a common diffusion region.

31. The method according to claim 30 further comprising coupling a source of the first MOS device with the common diffusion region and coupling a drain of the second MOS device with the common diffusion region.

32. The method according to claim 29 wherein the shunting comprises shunting using a parasitic bipolar transistor.

33. The method according to claim 29 wherein the shunting comprises shunting electrostatic discharge currents.

34. The method according to claim 29 wherein the coupling of the cascode comprises coupling a cascode having first and second NMOS devices.

35. The method according to claim 29 further comprising isolating the gate from the stress current.

36. The method according to claim 29 further comprising isolating the gate from a biasing voltage supply.

37. A method of protecting a semiconductor device comprising:
   coupling a cascode intermediate a pad and a ground connection of a semiconductor device, the cascode including first and second MOS devices electrically coupled via a common diffusion region, the first MOS device being coupled with the pad and the second MOS device being coupled with the ground connection;
   shunting a stress current from the pad to the ground connection using the cascode; and
   providing a gate of the first MOS at a digital low value during the shunting.

38. The method according to claim 37 further comprising coupling a source of the first MOS device with the common diffusion region and coupling a drain of the second MOS device with the common diffusion region.

39. The method according to claim 37 wherein the shunting comprises shunting using a parasitic bipolar transistor.

40. The method according to claim 37 wherein the shunting comprises shunting electrostatic discharge currents.

41. The method according to claim 37 wherein the coupling of the cascode comprises coupling a cascode having first and second NMOS devices.

42. The method according to claim 37 further comprising isolating the gate from the stress current during the shunting.

43. The method according to claim 37 further comprising isolating the gate from a biasing voltage supply.

44. A method of protecting a semiconductor device comprising:
   coupling a cascode intermediate a pad and ground connection of a semiconductor device, the cascode including first and second MOS devices electrically coupled via a common diffusion region, the first MOS device being coupled with the pad and the second MOS device being coupled with the ground connection;

shunting a stress current using the cascode;

biasing a gate of the first MOS device using a voltage source;

isolating the voltage source from the pad during the shunting; and biasing the gate at a digital low value during the shunting.

45. The method according to claim 44 further comprising coupling a source of the first MOS device with the common diffusion region and coupling a drain of the second MOS device with the common diffusion region.

46. The method according to claim 44 wherein the shunting comprises shunting using a parasitic bipolar transistor.

47. The method according to claim 44 wherein the shunting comprises shunting electrostatic discharge currents.

48. The method according to claim 44 wherein the coupling of the cascode comprises coupling a cascode having first and second NMOS devices.

49. The method according to claim 44 further comprising isolating the gate from the stress current.

50. A method of protecting a semiconductor device comprising:

coupling a cascode intermediate a pad and a ground connection of a semiconductor device, the cascode including first and second MOS devices electrically coupled in series, the first MOS device being coupled with the pad and the second MOS device being coupled with the ground connection;

shunting a stress current using the cascode; and providing a digital low value to a gate of the first MOS device during the shunting.

51. The method according to claim 50 further comprising coupling the first MOS device and second MOS device via a common diffusion region.

52. The method according to claim 51 further comprising coupling a source of the first MOS device with the common diffusion region and coupling a drain of the second MOS device with the common diffusion region.

53. The method according to claim 50 wherein the shunting comprises shunting using a parasitic bipolar transistor.

54. The method according to claim 50 wherein the shunting comprises shunting electrostatic discharge currents.

55. The method according to claim 50 wherein the coupling of the cascode comprises coupling a cascode having first and second NMOS devices.

56. The method according to claim 50 further comprising biasing the gate of the first MOS device using a voltage source and isolating the voltage source from the pad during the shunting.

57. The method according to claim 50 further comprising isolating a gate of the first MOS device from the stress current.

* * * * *